United States Patent
Ebrish et al.

(10) Patent No.: US 11,031,250 B2
(45) Date of Patent: Jun. 8, 2021

(54) SEMICONDUCTOR STRUCTURES OF MORE UNIFORM THICKNESS

(71) Applicant: International Business Machines Corporation, Armonk, NY (US)

(72) Inventors: Mona A. Ebrish, Albany, NY (US); Michael Rizzolo, Delmar, NY (US); Son Nguyen, Schenectady, NY (US); Raghuveer R. Patlolla, Guilderland, NY (US); Donald F. Canaperi, Bridgewater, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/204,336

(22) Filed: Nov. 29, 2018

(65) Prior Publication Data

US 2020/0176263 A1    Jun. 4, 2020

(51) Int. Cl.
*H01L 27/088* (2006.01)
*H01L 21/3105* (2006.01)
*H01L 29/78* (2006.01)
*H01L 27/22* (2006.01)
*H01L 21/311* (2006.01)

(52) U.S. Cl.
CPC .. *H01L 21/31053* (2013.01); *H01L 21/31116* (2013.01); *H01L 27/228* (2013.01); *H01L 29/7851* (2013.01)

(58) Field of Classification Search
CPC ......... H01L 21/31053; H01L 21/31116; H01L 27/228; H01L 29/7851
See application file for complete search history.

(56) References Cited

U.S. PATENT DOCUMENTS

| | | | |
|---|---|---|---|
| 5,795,495 | A | 8/1998 | Meikle |
| 5,969,409 | A | 10/1999 | Lin |
| 6,060,393 | A | 5/2000 | Ngo et al. |
| 7,125,776 | B2 | 10/2006 | Achuthan et al. |
| 8,294,192 | B2 | 10/2012 | Weimer et al. |
| 8,492,194 | B2 | 7/2013 | Breitwisch et al. |
| 9,269,983 | B2 | 2/2016 | Lipka et al. |
| 2008/0305725 | A1 | 12/2008 | Yu et al. |

(Continued)

FOREIGN PATENT DOCUMENTS

WO    2013109461 A1    7/2013

OTHER PUBLICATIONS

Banerjee et al., "Chemical Mechanical Planarization", ECS Transactions, 13 (4), 2008, pp. 1-19, © The Electrochemical Society.

(Continued)

*Primary Examiner* — Victor A Mandala
*Assistant Examiner* — Colleen E Snow
(74) *Attorney, Agent, or Firm* — Michael A. Petrocelli

(57) ABSTRACT

A semiconductor device and method of formation thereof. The semiconductor device includes a portion of a first material that abuts a portion of a second material and surrounds at least a portion of a semiconductor component. The first material has a first composition and a first index of refraction and is of a same type of material as the second material. The second material has a second composition and a second index of refraction. An opening in the first material exposes a portion of the semiconductor component.

12 Claims, 9 Drawing Sheets

(56) References Cited

U.S. PATENT DOCUMENTS

2013/0193565 A1* 8/2013 Tu .............................. G03F 1/46
                                                      257/637
2015/0188033 A1    7/2015 Lamborn et al.
2015/0357559 A1   12/2015 Nagel et al.
2017/0033283 A1    2/2017 Pinarbasi et al.
2018/0182753 A1*   6/2018 Ponoth ................ H01L 27/0629

OTHER PUBLICATIONS

Lai, Jiun-Yu, "Mechanics, Mechanisms, and Modeling of the Chemical Mechanical Polishing Process", Submitted to Department of Mechanical Engineering, Thesis, Feb. 2001, Chapter 1, © 2001 Massachusetts Institute of Technology, pp. 16-29.

Lane et al., "Chemical Mechanical Planarization", Microelectronic Engineering, Rochester Institute of Technology, © Mar. 27, 2010 Dr. Lynn Fuller, Professor, pp. 1-74, <https://people.rit.edu/lffeee/lec_cmp.pdf>.

Lin et al."Process optimization and integration for silicon oxide intermetal dielectric planarized by chemical mechanical polish" Journal of the Electrochemical Society, 146(5), 1999, pp. 1984-1990.

* cited by examiner

SEMICONDUCTOR STRUCTURES OF MORE UNIFORM THICKNESS

BACKGROUND OF THE INVENTION

The present invention relates generally to the field of semiconductor structures, and more particularly to forming semiconductor structures of uniform thickness.

Semiconductor structures are typically formed by alternating processes of material deposition and material removal. In this manner, the semiconductor structures are built up layer by layer. Small differences in uniformity of material thickness can affect subsequent processes for material addition or removal and ultimately change the electrical or physical characteristics of the resulting semiconductor structure.

SUMMARY

Embodiments of the present invention provide a semiconductor device and a method of forming said semiconductor device.

A first aspect of the present invention encompasses a method of forming a semiconductor device. The method comprising: forming a first layer of material on top of a first semiconductor structure, the first layer of material having a first composition and a first index of refraction; forming a second layer of material on top of first layer of material, the second layer of material having a second composition and a second index of refraction, wherein the first layer of material and the second layer of material are of a same type of material; and forming an opening to the first semiconductor structure by applying a first etching that etches through at least a first portion of the first layer of material to expose a portion of the first semiconductor structure.

A second aspect of the present invention encompasses a semiconductor device. The semiconductor device comprising: a first portion of a first material that surrounds part of a first semiconductor structure, the first portion of the first material having a first composition and a first index of refraction; a first portion of a second material abutting the first portion of the first material, the first portion of the second material having second composition and a second index of refraction, wherein the first portion of the first material and the first portion of the second material are of a same type of material; and a first opening that extends through at least a part of the first portion of the first material and exposes a portion of the first semiconductor structure.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
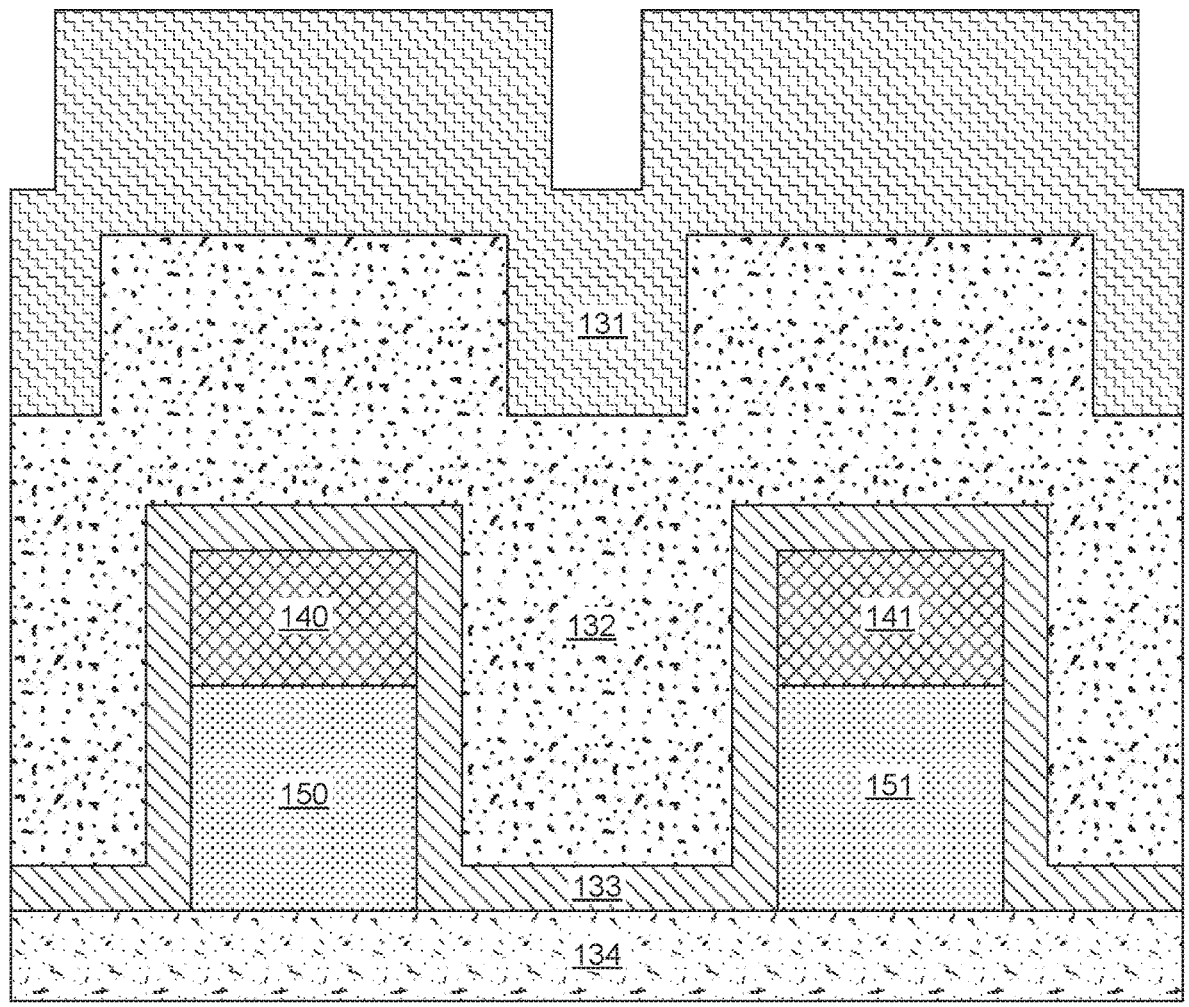
FIG. 1 illustrates a cross-sectional view depicting a semiconductor structure with two abutting layers of dielectric material, in accordance with an exemplary embodiment of the present invention.

The present invention will now be described in detail with reference to the Figures.

Embodiments of the present invention recognize that the uniformity of a layer of dielectric, or another material, may vary in thickness across a wafer. Embodiments of the present invention recognize that such a variation in uniformity may be exacerbated, i.e., increased, by the application of certain processes to the wafer. For example, application of chemical-mechanical-polishing (CMP) to a wafer may increase the variation in uniformity across the wafer. Embodiments of the present invention recognize that non-uniformity, i.e., increased variation in uniformity, may result in under etching of certain structures and/or over-etching of other structures across the wafer. Such a decrease in control over etching may result in semiconductor structures that exhibit unintended/unwanted electrical characteristics. For example, over etching may remove needed semiconductor structures or portions thereof. In another example, under-etching results in a layer of resistive material preventing formation of an electrical connection between two semiconductor structures. One having ordinary skill in the art readily recognizes the advantages presented by a process that enhances or otherwise increases uniformity and/or control during etching. The present invention provides a solution that increases one or both surface uniformity across a wafer and/or control during etching.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The present invention provides a solution that leverages the sensitivity of CMP processes to changes in dielectric composition to increase one or both surface uniformity across a wafer and/or control during etching. In one embodiment, the present invention provides improved top contact within a wafer or between wafer-to-wafer. In one embodiment, the present invention provides a reduction in undesirable series resistance in memory devices by increasing the uniformity of an inter-layer dielectric layer, which in turn reduces under-etching of a top contact. Embodiments recognize that several processes exist that allow for the selective addition and removal of material. As such, while only select processes are discussed herein for the selective addition and removal of material, embodiments encompass and recognize that a wide variety of processes for the selective addition and removal of material may be used without exceeding the scope of the present invention.

In general, as described herein, embodiments of the present invention leverage deposition of multiple layers of similar material of slightly varying composition. In some such embodiments, a CMP process is performed between at least two of these depositions. For example, in one embodiment, a scheme of (i) fast CMP dielectric removal (rates), (ii) thin slow CMP dielectric removal, (iii) fast CMP dielectric removal then (iv) slow CMP dielectric removal is leveraged to yield precise material height and/or thickness across a substrate, which increases overall planarization of the wafer.

As described below in conjunction with FIGS. 1-9, embodiments may include methods of forming semiconductor structures with improved uniformity in material thickness across a wafer. The method described below in conjunction with FIGS. 1-9 may be incorporated into typical semiconductor fabrication processes, such as fin field effect transistor (FinFET) fabrication processes, Magnetic Tunnel Junction (MTJ) fabrication processes, Phase-Change Memory (PCM) fabrication processes, and/or other semiconductor structure fabrication processes where material thickness may affect the final shape of the semiconductor structure, the mechanical properties of the semiconductor structure, and/or the electrical properties of the semiconductor structure, such as magnetic permeability, conductivity, resistivity and optical properties etc.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention. As used herein, semiconductor structures refer to one or more physical structures that comprise semiconductor devices.

As used herein, terms such as "depositing", "forming", and the like, refer to the disposition of layers or portions of materials in the present embodiments. Such processes may or may not be different than those used in the standard practice of the art of semiconductor structure fabrication. Such processes include but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, ion beam deposition (IBD), electron beam deposition, laser assisted deposition, chemical solution deposition, or any combination of those methods.

As used herein, terms such as "removing", "etching", and the like, refer to the removal of material from layers or portions of material from components included in semiconductor structures. In some embodiments and scenarios, certain types of material are removed using selective etching processes, such as a selective wet etching process. Semiconductor components, as used herein, may include, but are not limited to, resistive, conductive, capacitive, and current switching semiconductor devices, and include combinations and/or portions of those semiconductor components thereof. Such semiconductor components, may include, but are not limited to, capacitors, resistors, transistors, and wires, and include combinations and/or portions of those semiconductor components thereof.

One selective etching process includes, but is not limited to, an ion-sputtering (or Ion Beam etching) process with a gas resource including, but not limited to: Ar, He, Xe, Ne, Kr, N2 or H2. The ion-sputtering process removes material by atom bombardment and works by line of sight allowing horizontal surfaces to be removed while leaving vertical surfaces with minimal sidewall removal. For example, an Ar sputtering process is utilized to selectively remove portions of a hard mask material using a conventional Ar sputtering process that is used in interconnect technology.

In some embodiments and scenarios, certain types of materials are removed using relatively non-selective etching processes such that a wide range of materials are etched, for example, CMP. In some embodiments, CMP utilizes a combination of chemical etching and mechanical polishing to smooth the surface and even out any irregular topography, i.e., CMP increases a top surface uniformity by removal of material from that surface.

In some embodiments, certain etching processes are sensitive, when compared to other etching processes, to variations in the makeup of a given material such that a relatively small change in composition of a material may result in a comparatively large change in etching rate for that material. In some embodiments, certain etching processes are relatively insensitive to variations in the makeup of a given material such that relatively small changes in composition have minimal effect on etching rates, such as with reactive ion etching (RIE). Those skilled in the art understand that many different techniques may be used to remove various materials and portions thereof within the scope of the current invention. In some embodiments, etching is used to transfer a pattern onto a layer of material, for example, a dry etching process, a wet chemical etching process or a combination thereof. The term "dry etching" is used herein to denote an etching technique such as reactive-ion etching (RIE), ion beam etching (IBE), plasma etching, or laser ablation. In the illustrative embodiment, in FIGS. 7 and 8, material is removed, i.e., openings in materials are formed, by employing an RIE process. RIE uses chemically reactive plasma with various reactive gases (typically Halide based or/and O2/N2/NH3/H2), generated by an (radio frequency) RF with or without magnetic field, to remove various materials. A person of ordinary skill in the art will recognize that the type of plasma and gases used will depend on the material being removed. In some embodiments, a patterned etch mask is used to control what material is etched and the mask is not removed after RIE. In other embodiments, a patterned etch mask is removed at after RIE.

Embodiments of the present invention provide examples of a process for multiple layer material deposition that leverages differences in material removal rates, which result from composition differences between the layers of material, to increase consistency in final material thickness. In general, the resulting consistency has differences in material thickness across a section of a wafer (e.g., across a 5-100 nano-meters (nm) section) where a thickness of a layer of material on top of a first semiconductor structure differs from a thickness of the that layer of material on top of a second semiconductor structure, in that section of wafer, by at most three percent or one standard deviation (SD) of the average thickness of the material across the section of wafer. A standard deviation (which may be also represented by the lowercase Greek letter sigma σ or the Latin letter s) is a measure that is used to quantify the amount of variation in, or dispersion of, a set of data values.

While the examples illustrated and explained herein are directed to the formation and removal of inter-layer-dielectric material, one having ordinary skill in the art appreciates that the methods of the present invention may be leveraged to form other types of material layers with increased thickness consistency. For example, embodiments encompass a process for multilayer metal deposition over patterned topological structure/CMP (metal damascene) that leverages the described approach to improve uniformity in the thickness of the resulting metal layer.

FIGS. 1-4 depict two adjacent semiconductor columns/pillars on a wafer. In the depicted embodiments, these adjacent semiconductor columns/pillars are composed of (i) top components 140 bottom component 150 and (ii) top component 141 with bottom component 151. FIGS. 1-4 illustrate the relative similarity in thickness of materials (133, 132, and 131) over such adjacent semiconductor columns/pillars. In contrast, FIGS. 5-9 illustrate differences in thickness of materials over non-adjacent semiconductor columns/pillars on a wafer. Embodiments recognize that there is inconsistency in (i) the thickness of materials over semiconductor columns/pillars more centrally located on a wafer when compared to (ii) the thickness of materials over semiconductor columns/pillars more distally located on a wafer, i.e., thickness of material over the semiconductor columns/pillars increases when moving from the center of the wafer to the edge of the wafer. In the depicted embodiments, top components are composed of a hard mask material. In other embodiments, top components are composed of another type of material. In some embodiments, top components are integrated with bottom components. In general, top components and bottom components as used herein describe and otherwise denote any number of semiconductor structures and components, and combinations thereof, that may be formed on a substrate and covered by one or more layers of material with a surface that has a significantly consistent distance to the substrate during at least a portion of the manufacturing processes. Embodiments recognize and provide for the formation of semiconductor components (both top and bottom) on the substrate as shown in FIGS. 1-8 using a variety of techniques that will be understood by those having ordinary skill in the art considering the description provided herein. Embodiments further recognize and provide for the formation of semiconductor components (both top and bottom as well as additional layers of materials and other semiconductor components) as shown in FIG. 9 using a variety of techniques that will be understood by those having ordinary skill in the art in light of the description provided herein.

FIG. 1 illustrates a cross-sectional view depicting a semiconductor structure with two abutting layers of dielectric material, in accordance with an exemplary embodiment of the present invention. FIG. 1 includes top components 140 and 141 covering respective top surfaces of bottom components 150 and 151. The bottom surfaces of bottom components 150 and 151 respectively abut the top surface of substrate layer 134. FIGS. 1-9 respectively illustrate a layer, or portions thereof, of encapsulation material 133. Encapsulation material could be, for example, but is not limited to, one or a combination of: SiNx, SiCNx, SiCx, graded SiCNOx, and/or a stable metal oxide, e.g., MnSiOx and AlOx. As shown in FIGS. 1-8, various components and layers are formed on top of substrate layer 134. As such, one having ordinary skill in the art understands the orientation and positioning of various surfaces of the components and layers of material, respective to one another, as are illustrated in FIGS. 1-8.

In FIGS. 1, 4-7, and 9, two layers, or portions thereof, of inter-layer-dielectric (ILD) material are illustrated and denoted as layers 131 and 132. In these embodiments, ILD 131 and 132 have a similar material composition and material density. However, due to differences in the formation processes used and/or minor variations in chemical composition, the refractive index of ILD 131 is different from ILD 132. This difference in refractive index correlates to the minor variation between the two films bonding structures, compositions, and densities. Such minor differences can indicate significant changes between their respective CMP rates. Embodiments recognize that one having ordinary skill in the art can differentiate between materials such that materials can be categorized by their composition. In other words, each type of material is understood to have a range of possible compositions, based on one or both of elemental composition or chemical bonds, that will yield materials of sufficient similarity in composition, physical characteristics, electrical characteristics, and common use in the industry, that one having ordinary skill in the art would recognize a given material as belonging to a given type of material. In general, types of material are often defined and categorized based, in part on, certain required electrical characteristics as well as one or both of elemental composition and bonding structure. Some embodiments recognize that two materials of the same type can have a composition that differ by less than a given percent that defines that material type. For example, two interlayer dielectric materials have an elemental composition (e.g., a difference in select elements represented in a periodic table of elements) that differs by two percent and have a difference in elemental bonding (i.e., a different bonding structure) of fifteen percent. One having ordinary skill in the art would readily recognize that even though both interlayer dielectric materials have a different composition, respective to each other, both interlayer dielectric materials belong to the same type of interlayer dielectric material.

In another example, two SiCOH films, with similar in Silicon (Si), Carbon (C), Oxygen (O), and Hydrogen (H) compositions, have slightly different bonding structures when compared to one another (for example, one of the films has slightly more Si—C bonds, slightly less Si—O bonds, and/or slightly more Si—OH bonds when compared to the other film) that lead to small differences in refractive index but yields relatively large differences in CMP rates (e.g., at least a 10% difference). Similar types of bonding variation can also result in minor RI variation in other type of dielectrics and other types of materials. In this embodiment, ILD 131 has a refractive index (RI) that is within 5% of, but is not identical to, the refractive index of ILD 132. For example, (i) the composition of ILD 131 may be SiCxOyHz, SiCxNy, SiNx, SiOx, OMCTS, etc., which respectively have a RI that is lower than the refractive index of ILD 132. In this example, ILD 132 may be SiCxOyHz, SiCxNy, SiNx, SiOx, or OMCTS, etc., with an RI that is higher than ILD 132.

Figure 2:
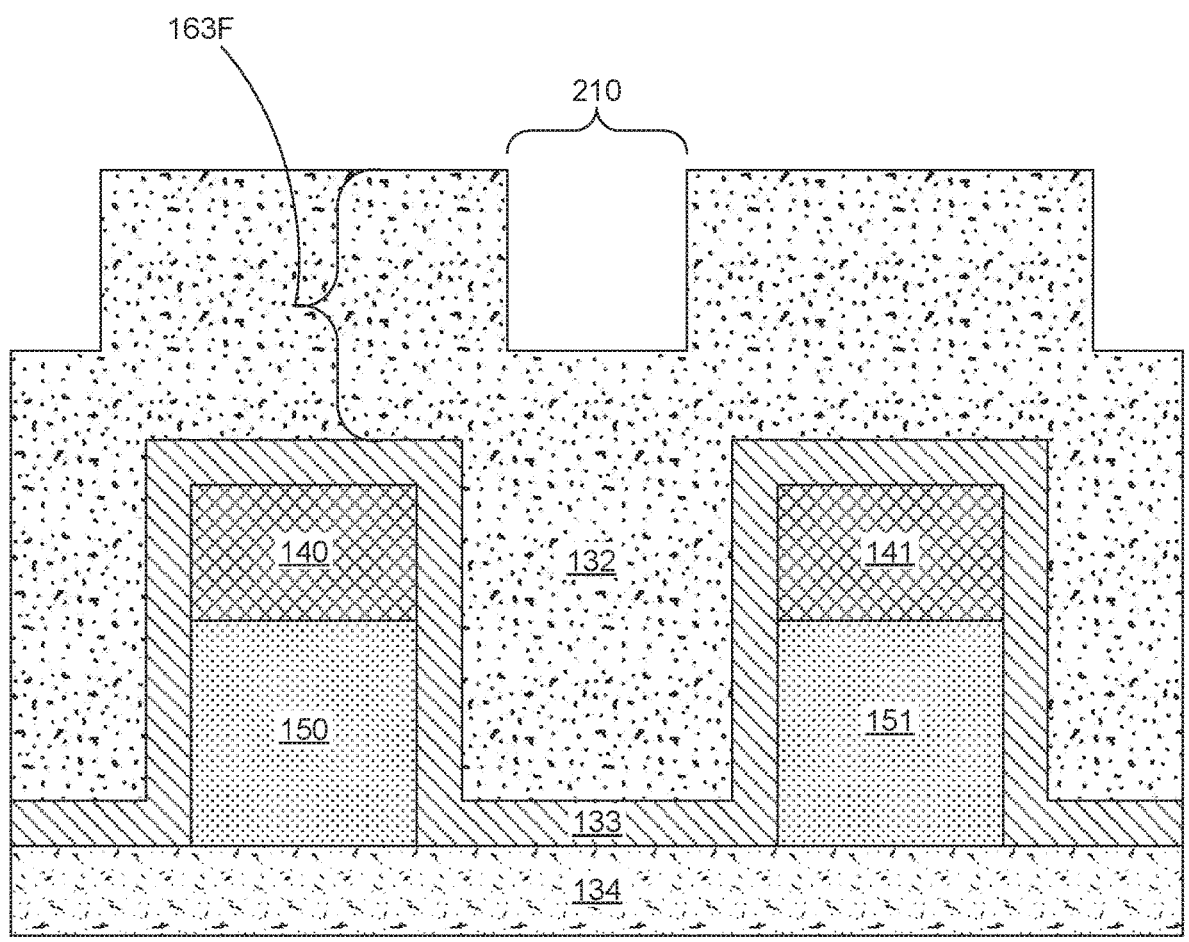
FIG. 2 illustrates a cross-sectional view depicting a semiconductor structure with a layer of dielectric material of a thickness, in accordance with an exemplary embodiment of the present invention.

FIG. 2 illustrates a cross-sectional view depicting a semiconductor structure with a layer of dielectric material of a thickness denoted by 163F, in accordance with an exemplary embodiment of the present invention. Embodiments recognize that there are openings, such the opening denoted using bracket 210, in a top surface of ILD 132 such that the top surface is not consistent in height across the wafer as measured perpendicular to substrate layer 134, i.e., the distance between the top of ILD 132 and substrate layer 134 is inconsistent. Embodiments recognize that it may be desirable to have a consistent layer of inter-layer-dielectric material (or another material) such that the top surface of that layer of material is consistent in height, relative to another layer of material, across the wafer as measured perpendicular to the top surface of substrate layer 134 that abuts bottom components 150 and 151 and encapsulation material 133.

Figure 3:
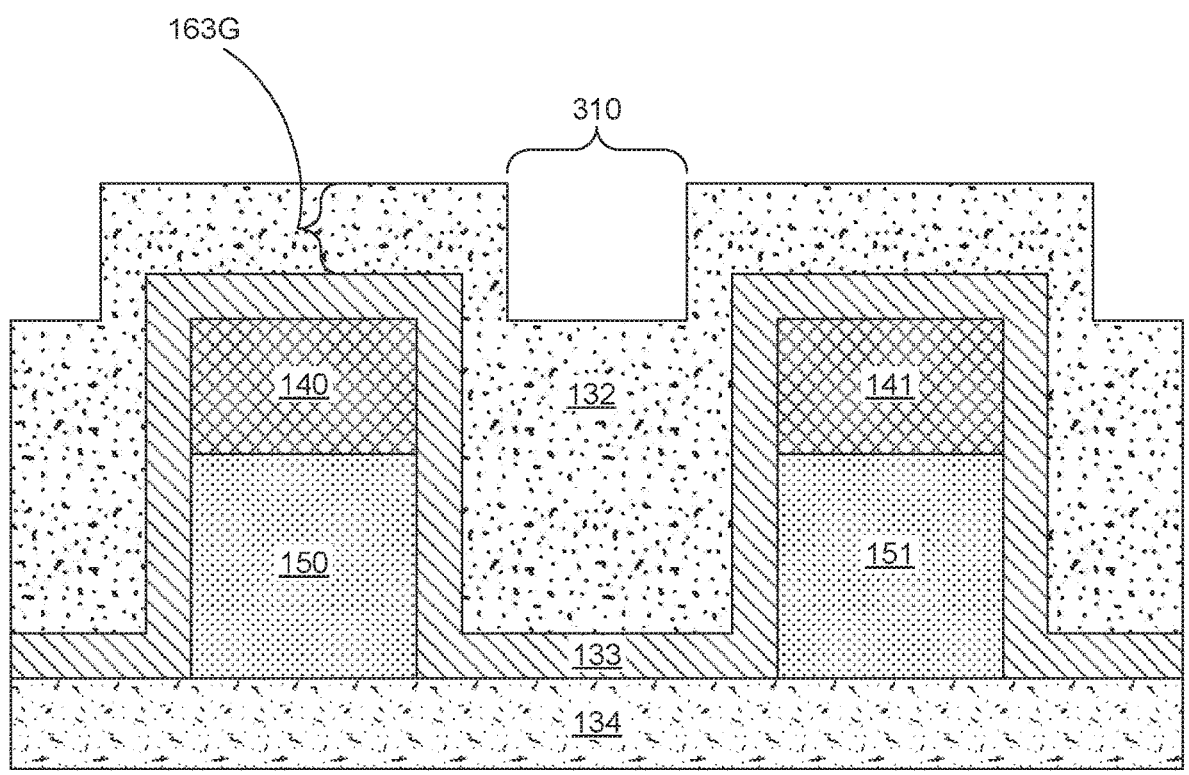
FIG. 3 illustrates a cross-sectional view depicting a semiconductor structure with a layer of dielectric material with a reduced thickness, in accordance with an exemplary embodiment of the present invention.

FIG. 3 illustrates a cross-sectional view depicting a semiconductor structure with a layer of dielectric material with a reduced thickness, in accordance with an exemplary embodiment of the present invention. FIG. 3 illustrates a semiconductor structure that results from the application of a reactive ion etch (RIE) to the semiconductor structure of FIG. 2, which reduces the thickness of ILD 132 from 163F to 163G. Embodiments recognize that application of such an RIE process may improve the filling profile, i.e., reduce or prevent voids between layers of material. Embodiments recognize that there are openings, such the opening denoted using bracket 310, in a top surface of ILD 132 such that the top surface is not consistent in height across the wafer, i.e., the distance between the top of ILD 132 and substrate layer 134 is more than 10% inconsistent between adjacent semiconductor columns/pillars on the wafer.

Figure 4:
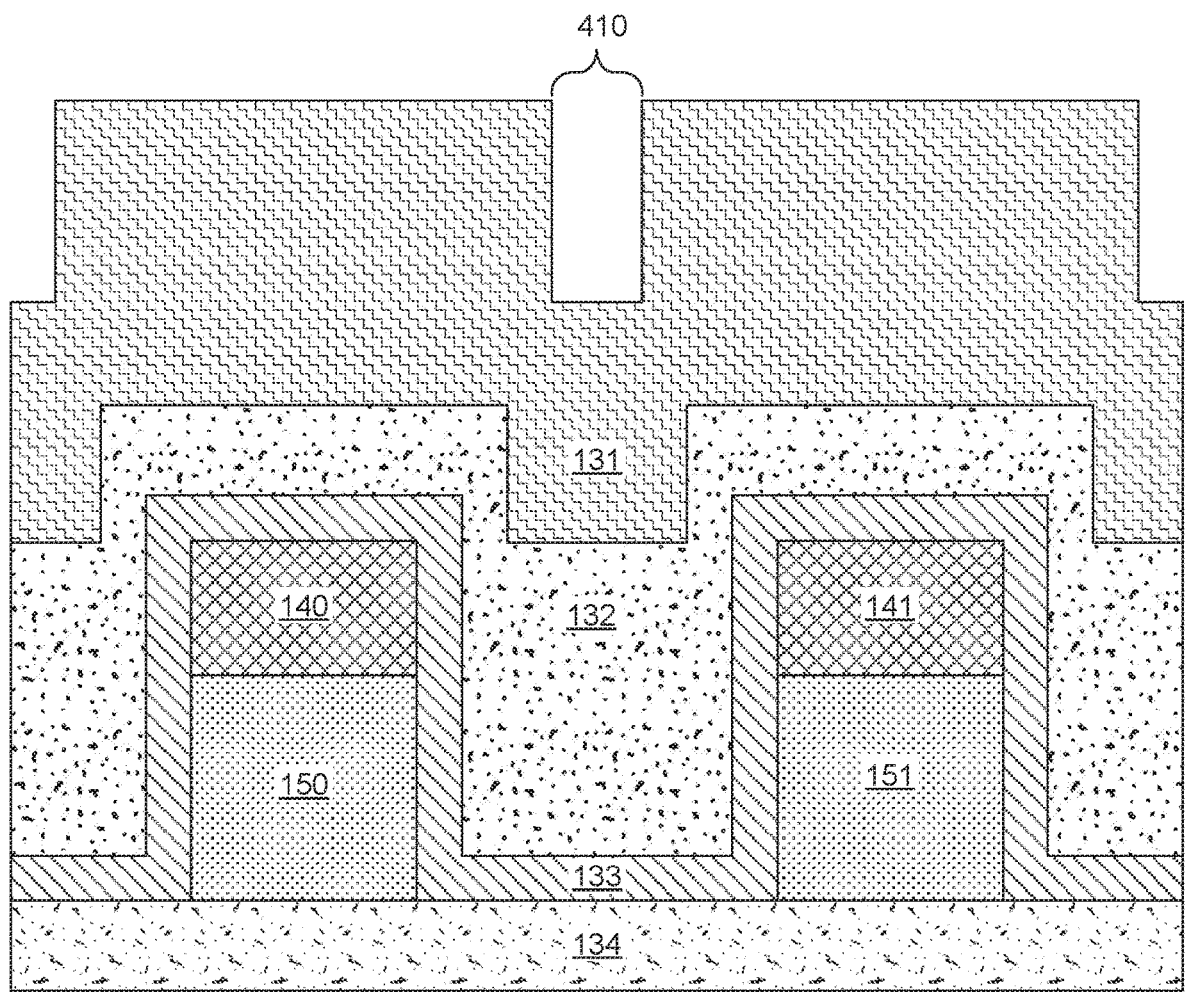
FIG. 4 illustrates a cross-sectional view depicting a semiconductor structure with two abutting layers of dielectric material with one layer of dielectric material having a reduced thickness, in accordance with an exemplary embodiment of the present invention.

FIG. 4 illustrates a cross-sectional view depicting a semiconductor structure with two abutting layers of dielectric material with one layer of dielectric material having a reduced thickness, in accordance with an exemplary embodiment of the present invention. FIG. 4 illustrates a semiconductor structure that results from the deposition of a layer of ILD 132 onto the semiconductor structure of FIG. 3. Embodiments recognize that the deposition of ILD 131 onto ILD 132 fills in opening 310 (shown in FIG. 3) with ILD material. Embodiments further recognize that an opening thus exists, denoted using bracket 410, in a top surface of ILD 131 such that the top surface of ILD 131 is not consistent in height across the wafer as measured perpendicular to substrate layer 134, i.e., the distance between the top of ILD 132 and substrate layer 134 is more inconsistent, i.e., above a threshold for an acceptable level of inconsistency, between adjacent semiconductor columns/pillars on the wafer. Embodiments recognize that a threshold for an acceptable level of inconsistency in the flatness of a plane of material relative to substrate layer 134 is understood by one having skill in the art. One having skill in the art recognizes that having greater than the threshold for an acceptable level of inconsistency in the flatness of the plane of material relative to substrate layer 134 may negatively impact the formation of, or functionality of, subsequent semiconductor structures.

Figure 5:
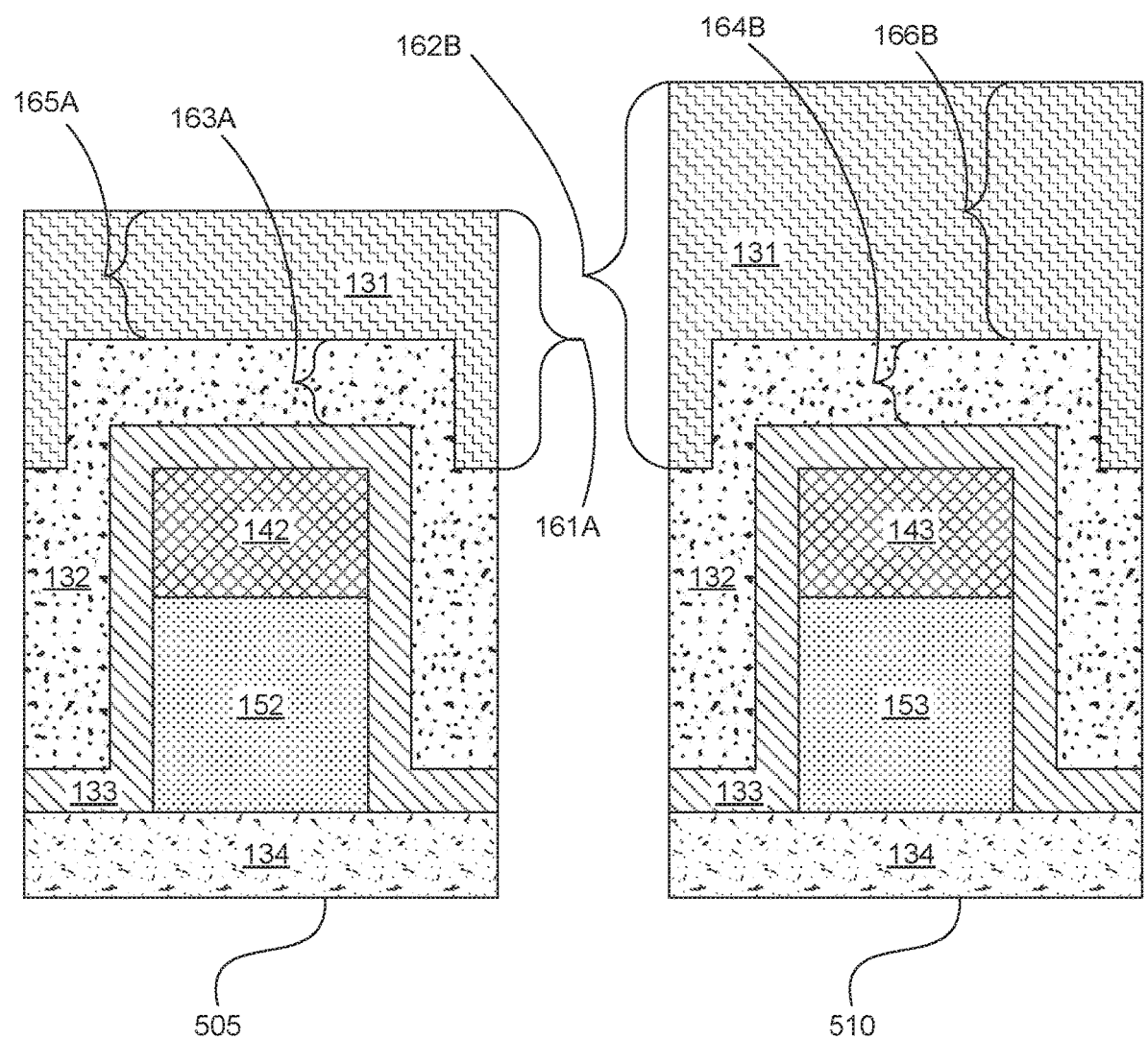
FIG. 5 illustrates a cross-sectional view depicting differences in material thickness during CMP that result from differences in location dependent rates of material removal for two semiconductor structures on a substrate, in accordance with an exemplary embodiment of the present invention.

FIG. 5 illustrates a cross-sectional view depicting differences in material thickness during CMP that result from differences in location dependent rates of material removal over two semiconductor structures on a substrate, in accordance with an exemplary embodiment of the present invention. Embodiments recognize that this application of CMP removes material such that the portion of ILD 131 that included openings, such as opening 410 of FIG. 4, is removed. In this embodiment, FIG. 5 illustrates material thickness at a first point in time during a CMP process. In some scenarios and embodiments, the CMP process is carried out in a step wise fashion such that FIG. 5 illustrates the semiconductor structures on a substrate after a first round of the CMP has completed. In this embodiment, the CMP slurry is a standard TaN liner slurry. Further, embodiments recognize that the CMP rates of materials can be either faster or slower, corresponding to types of material with differences in RI.

While the portion of ILD 131 that included openings, such as opening 410 of FIG. 4, has been removed, there is still an unacceptable level of inconsistency in the distance between a top surface of ILD 131 and substrate layer 134, as is described with reference to FIG. 5.

As shown, FIG. 5 includes two non-adjacent semiconductor column/pillar structures (505 and 510) on a wafer that are produced by a CMP process being applied to the wafer of FIG. 4. The non-adjacent semiconductor columns/pillars are composed of (i) top component 142 with bottom component 152 and (ii) top component 143 with bottom component 153. FIG. 5 illustrates differences in thickness of materials over non-adjacent semiconductor columns/pillars on a wafer. As such, the thickness of ILD 131 over the semiconductor column/pillar of semiconductor column/pillar structure 505, which is more centrally located on a wafer, is thinner when compared to the thickness of ILD 131 over the semiconductor column/pillar of semiconductor column/pillar structure 510, which is more distally located on the wafer, i.e., thickness of material over the semiconductor columns/pillars increases when moving from the center of the wafer to the edge of the wafer.

In this embodiment, a maximum thickness (162B) of ILD 131 over a plane (not shown) that intersects the top of top component 143 is more than 20% greater than the maximum thickness (161A) of ILD 131 over a plane (not shown) that intersects the top of top component 142. In this embodiment, the thickness (166B) of ILD 131 over top component 143 with bottom component 153 is more than 20% greater than the thickness (165A) of ILD 131 over top component 142 with bottom component 152.

Also, in this embodiment, the thickness (164B) of ILD 132 over top component 143 with bottom component 153 is approximately equal to the thickness (163A) of ILD 132 over top component 142 with bottom component 152. As such, a top surface of ILD 131 of column/pillar structure 505 is closer to substrate layer 134 when compared to the top surface of ILD 131 of column/pillar structure 510 relative to substrate layer 134. In other words, a distance between the top surface of ILD 131 and substrate layer 134 of column/pillar structure 505 is less than a distance between the top surface of ILD 131 and substrate layer 134 of column/pillar structure 510. Further, the difference between these distances exceeds a threshold for an acceptable level of inconsistency in the distance between a top surface of ILD 131 and substrate layer 134.

Figure 6:
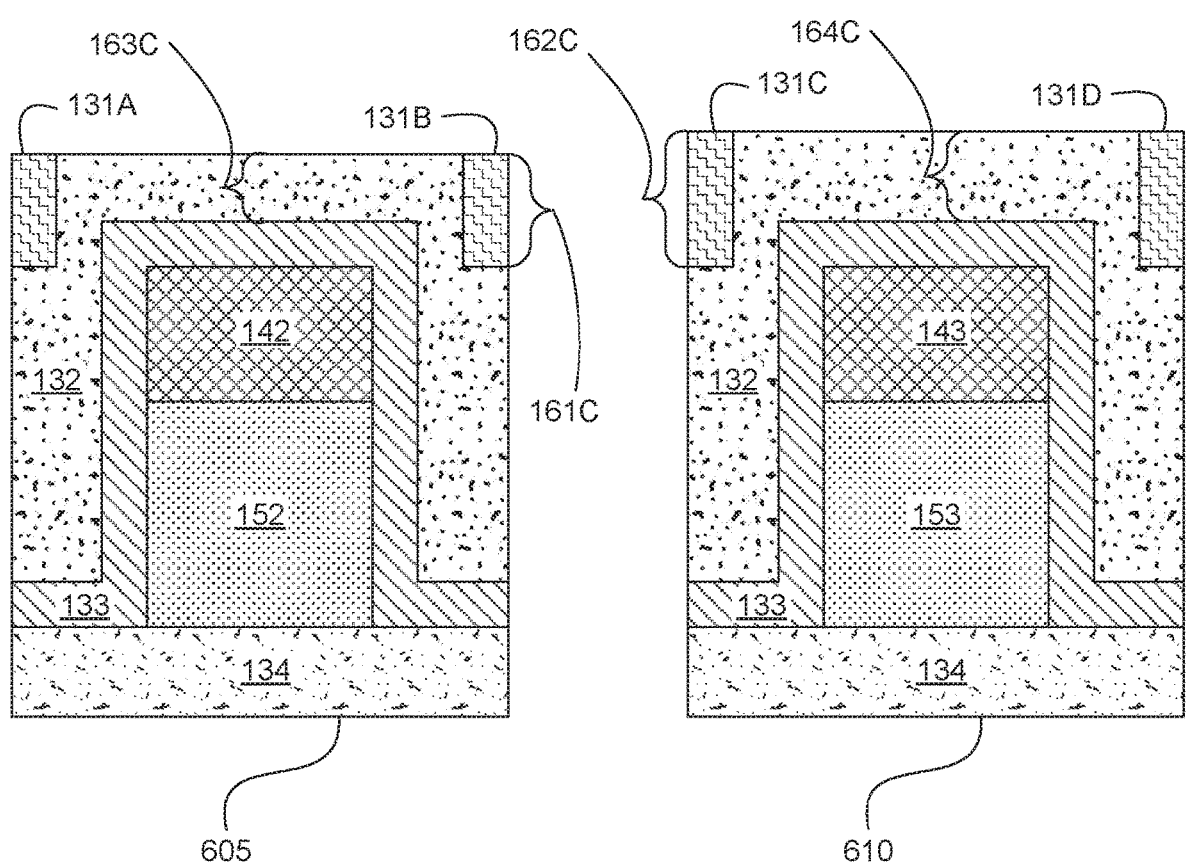
FIG. 6 illustrates a cross-sectional view depicting a difference in material thickness after CMP material removal for two semiconductor structures on a substrate, in accordance with an exemplary embodiment of the present invention.

FIG. 6 illustrates a cross-sectional view depicting a difference in material thickness after CMP material removal for two semiconductor structures on a substrate, in accordance with an exemplary embodiment of the present invention. In this embodiment, FIG. 6 illustrates material thickness at a second point in time during a CMP process. In some scenarios and embodiments, CMP is carried out in a step wise fashion such that FIG. 6 illustrates semiconductor structures on a substrate after a second round of the CMP has completed. In this embodiment, the two non-adjacent semiconductor column/pillar structures (605 and 610) are the results of the application of CMP processes to the two non-adjacent semiconductor column/pillar structures (505 and 510) of FIG. 5. As depicted, in this embodiment, the thickness (164C) of ILD 132 over top component 143 with bottom component 153 is only slightly greater than the thickness (163C) of ILD 132 over top component 142 with bottom component 152. In this process, the rate of material removal slowed for semiconductor column/pillar structure 605 when the CMP process reached ILD 132. As such, during that same time period, the rate of material removal for semiconductor column/pillar structure 610, on average, was greater than the average rate of material removal for semiconductor column/pillar structure 605. This difference in average rate of removal of material allowed semiconductor column/pillar structure 610 to remove a greater amount of material compared to the amount of material removed for semiconductor column/pillar structure 605. As a result, the difference in respective distances between the top surfaces of the ILD layers (formed by the collective top surfaces of ILD 131 and 132) and substrate layer 134 for semiconductor column/pillar structure 605 and 610 is reduced when compared to the differences in distance of FIG. 5. In other words, across the wafer, the distance between the top surface of the ILD and the substrate is more consistent. As shown in FIG. 6, portions of ILD 131 remain. For semiconductor column/pillar structure 605, ILD portions 131A and 131B have a thickness denoted by bracket 161C. For semiconductor column/pillar structure 610, ILD portions 131C and 131D have a thickness denoted by bracket 162C. Similar to the difference in thickness for ILD 132 (based on the comparison of 163C and 164C), there exists a difference in thickness in these remaining portions of ILD 131, based on the comparison of 161C and 162C. As such, ILD portions 131C and 131D of semiconductor column/pillar structure 610 have a greater thickness when compared to the thickness of ILD portions 131A and 131B of semiconductor column/pillar structure 605.

Figure 7:
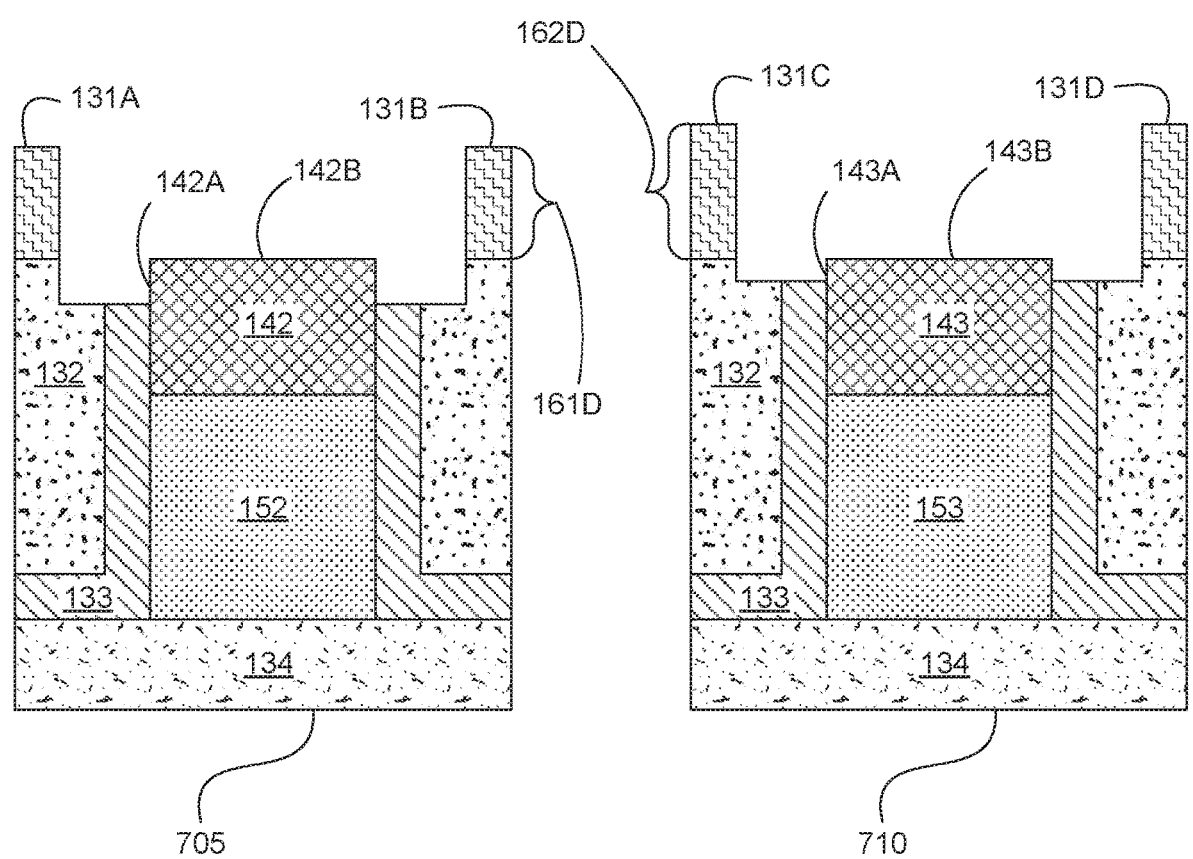
FIG. 7 illustrates a cross-sectional view depicting exposure of respective surfaces for components included two semiconductor structures on a substrate, in accordance with an exemplary embodiment of the present invention.

FIG. 7 illustrates a cross-sectional view depicting exposure of respective surfaces for components included two semiconductor structures on a substrate, in accordance with an exemplary embodiment of the present invention. In this process, RIE is applied to the semiconductor column/pillar structures on the wafer of FIG. 6 to remove a consistent portion of ILD material over semiconductor column/pillar structures 605 and 610. The result of this process is the semiconductor column/pillar structures 705 and 710. As depicted, respective top surfaces 142B and 143B and portions of side surfaces 142A and 143A, of top components 142 and 143, have been exposed by etching away portions of ILD 131, ILD 132, and encapsulation material 133. As such, the top surfaces for both of top components 142 and 143 are fully exposed and the total exposed surface area for top components 142 and 143 within an acceptable threshold of difference from each other. Embodiments recognize that, even while integrated into a single layer of ILD material, portions of ILD 131 and 132 retain their respective IR properties and can be identified accordingly. As shown in FIG. 7, portions of ILD 131 remain. For semiconductor column/pillar structure 705, ILD portions 131A and 131B have a thickness denoted by bracket 161D. For semiconductor column/pillar structure 710, ILD portions 131C and 131D have a thickness denoted by bracket 162D. Similar to the difference in thickness based on the comparison of 161C and 162C, there exists a difference in thickness in these remaining portions of ILD 131, based on the comparison of 161D and 162D. As such, ILD portions 131C and 131D of semiconductor column/pillar structure 710 have a greater thickness when compared to the thickness of ILD portions 131A and 131B of semiconductor column/pillar structure 705. Further note that the thickness of 161D is equal to or less than 161C since small amounts of ILD portions 131A and 131B may have been removed by the RIE. Likewise, the thickness of 162D is equal to or less than 162C since small amounts of ILD portions 131C and 131D may have been removed by the RIE. In this embodiment, such losses of ILD 131 material of ILD portions 131A, 131B, 131C, and 131D are minimal and unintentional.

Figure 8:
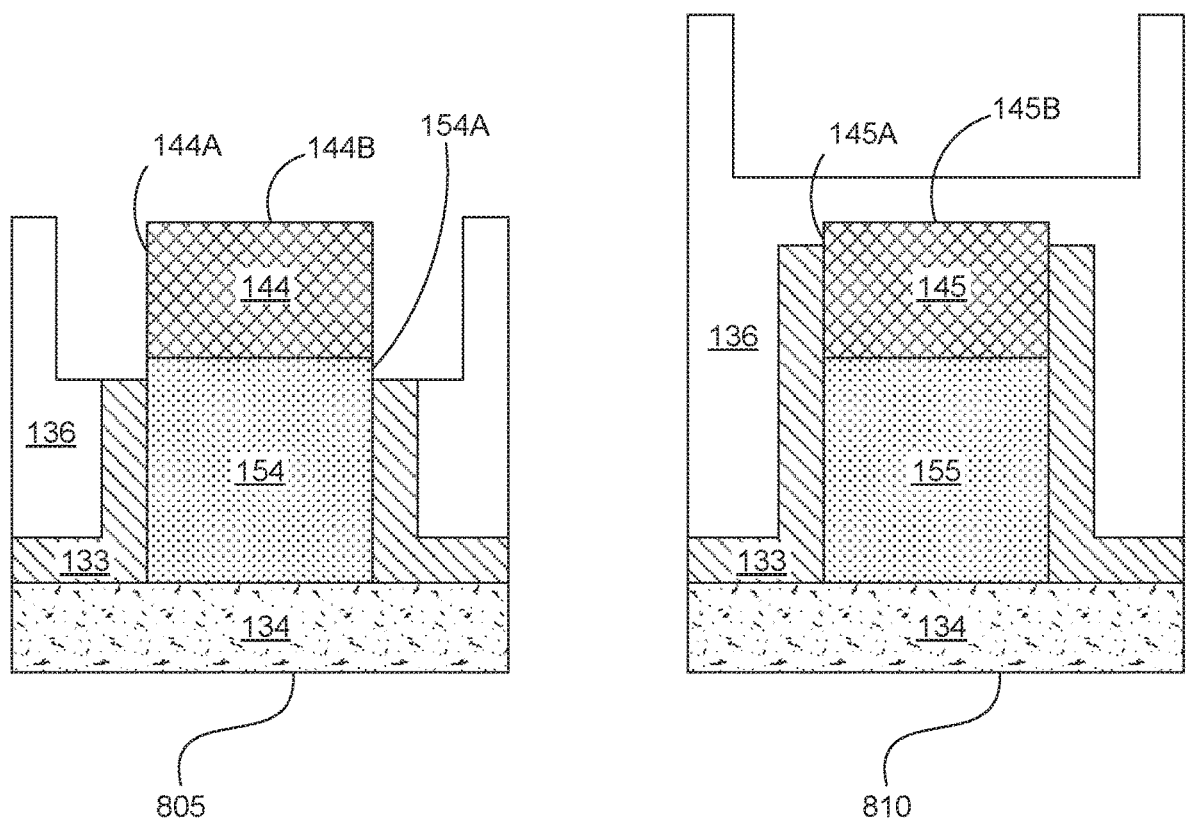
FIG. 8 illustrates a cross-sectional view depicting examples of semiconductor structures that illustrate results of over-etching and under-etching.
Figure 9:
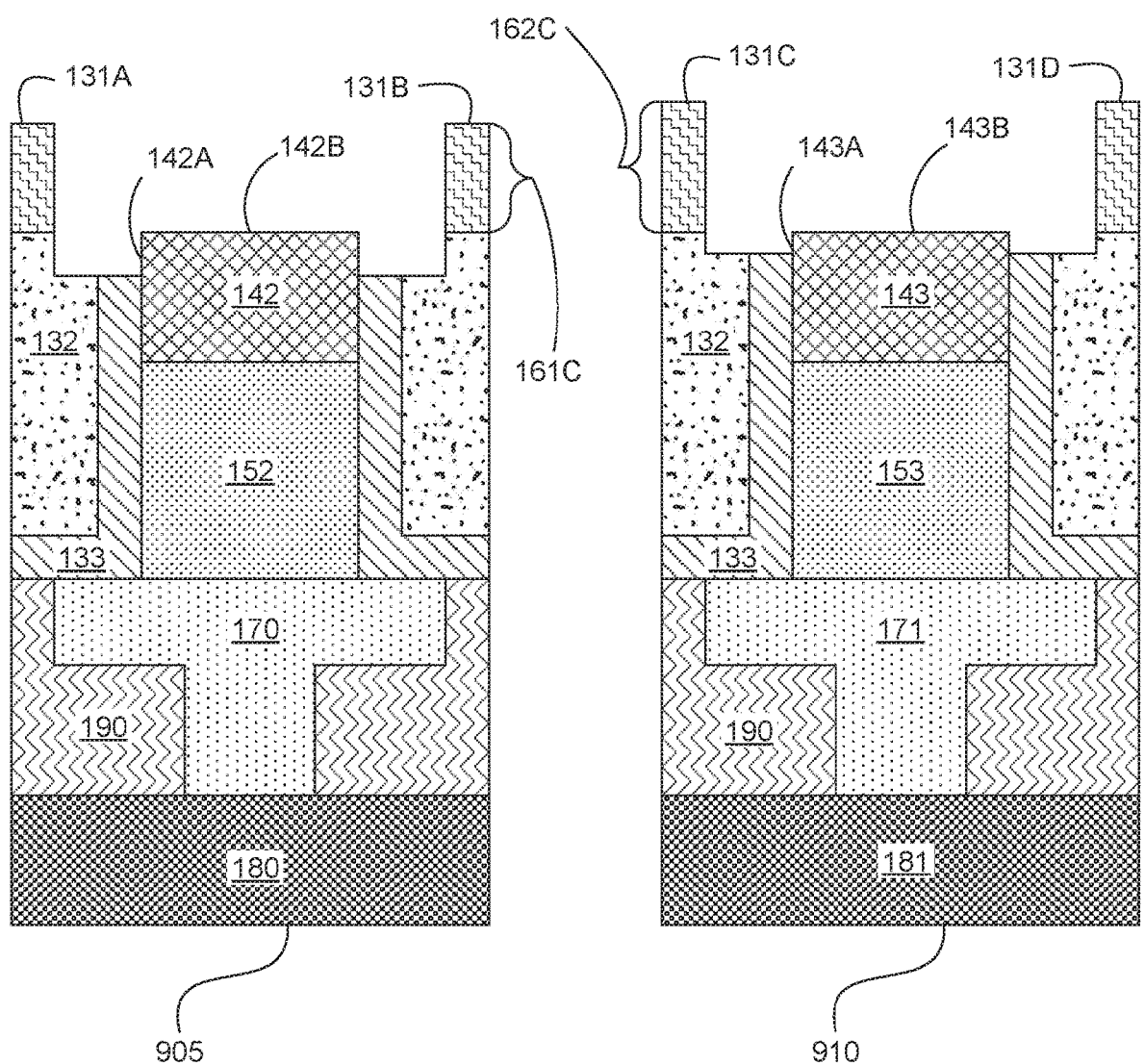
FIG. 9 illustrates a cross-sectional view depicting a semiconductor structure with improved uniformity in material thickness across a wafer, in accordance with an exemplary embodiment of the present invention.

FIG. 8 illustrates a cross-sectional view depicting examples of semiconductor structures that illustrate results of over-etching and under-etching on a single wafer. In the depicted examples, a single type of IDL 136, with a uniform IR, was deposited over semiconductor column/pillar structure 805 and 810. After application of CMP and RIE, similar to the processes described in FIGS. 5 and 7, the IDL material was reduced in thickness and openings created intended to expose portions of top components 144 and 145. However, as shown, the opening for semiconductor column/pillar structure 805 is over-etched and the opening for semiconductor column/pillar structure 810 is under-etched. For semiconductor column/pillar structure 805, the opening not only exposed the top (144B) and the entire side (144A) of top component 144, but also a portion of bottom component 154, denoted 154A. While not illustrated, a portion of bottom component 154, whose location is denoted by 154A, is removed by the RIE process. One having skill in the art recognizes that over-etching into components such as bottom component 154 may result in detrimental formation of unintended structures, such as electrical connections to portions of bottom component leading to short circuits or other unintended effects, and/or the degradation/removal of portions of bottom component 154, which may negatively affect their electrical and/or physical characteristics.

Regarding semiconductor column/pillar structure 810, the entire top surface, denoted 145B, and side surface, denoted 145A, of top component 145, denoted 145B, is still covered by a portion of ILD 136. One having skill in the art recognizes that under-etching, such as that shown by semiconductor column/pillar structure 810, can prevent the formation of intended structures, such as an electrical connection to top component 145. As such, embodiments recognize that use of a single ILD with a given IR may result in some semiconductor column/pillar structures located near a center of a wafer being over-etched, while other semiconductor column/pillar structures located near an edge of that same wafer may be under-etched. Such a lack of consistency in material etching generally reduces yields from a single wafer since only certain semiconductor column/pillar structures located between the center and the edge of the wafer will have an acceptable level of etching to expose their respective top components.

FIG. 9 illustrates a cross-sectional view depicting semiconductor structures with improved uniformity in material thickness across a wafer, in accordance with an exemplary embodiment of the present invention. FIG. 9 illustrates semiconductor column/pillar structure 905 and semiconductor column/pillar structure 910. As shown, top surfaces of bottom components 152 and 153 abut respective bottom surfaces of, and are in electrical contact with, top components 142 and 143. As shown, bottom surfaces of bottom components 152 and 153 abut respective top surfaces of, and are in electrical contact with, bottom contact structures 170 and 171. As depicted, bottom contact structures 170 and 171 are adjacent to, and partially surrounded by, two portions of inter layer dielectric material 190. Bottom contact structures 170 and 171 are further in electrical contact with middle-of-the-line, (MOL)/front-end-of-the-line (FEOL) structures 180 and 181. As shown in FIG. 9, various components and layers are formed on top of MOL/FEOL structures 180 and 181. As such, one having ordinary skill in the art understands the orientation and positioning of various surfaces of the components and layers of material included in FIG. 9.

FIG. 9 represents an alternative embodiment to the structures depicted in FIG. 7. FIG. 9 includes top components 142 and 143 covering respective top surfaces of bottom components 152 and 153. As depicted, respective top surfaces 142B and 143B and portions of side surfaces 142A and 143A have been exposed by etching that removed material similar to the processes described with reference to FIGS. 6-7. In some embodiments, the opening that includes top surfaces 142B and 143B and portions of side surfaces 142A and 143A is partially filled with a conductive material to form an electrical contact. In this embodiment, bottom components 152 and 153 represent back-end-of-the-line (BEOL) components. In one embodiment, bottom components 152 and 153 represent one or both of middle-of the-line (MOL) and BEOL components. In one embodiment, bottom components 152 and 153 represent at least part of pillar structures of memory devices, such as, for example, the pillar structures of magnetic tunnel junction (MTJ) devices. In MTJ devices, two ferromagnetic layers (a free magnetic layer and a fixed magnetic layer) are separated by a spacer/insulator/tunnel barrier layer (such as epitaxial MgO). The magnetization of one of the ferromagnetic layers (the free layer) can be switched by an input spin current. The other magnetic layer serves as the reference or pinned layer (PL), and is magnetostatically fixed, i.e., forms a fixed magnetic layer. The MTJ exhibits two stable resistance states depending on the orientation of the FL and PL magnetizations. The MTJ device is said to be in the low (high) resistance state, also referred to as the 'Parallel' ('Anti-Parallel') state, if the FL magnetization is in the same (opposite) direction relative to the PL. As such, in this embodiment, bottom components 152 and 153 include respective (i) free magnetic layers in physical/electrical contact with bottom surfaces of top components 142 and 143 and (ii) pinned layers in physical/electrical contact with top surfaces of bottom contact structures 170 and 171. In this embodiment, the FL magnetization state is of these respective free magnetic layers is changed by applying by an input spin current via top components 142 and 143. In one such embodiment, (i) bottom contact structures 170 and 171 form at least portions of electrodes that are connected to source/drain structures of transistors and (ii) top components 142 and 143 are electrically connected to, and may physically be included as part of, a bit line structure. One having ordinary skill in the art appreciates that loss of electrical contact between top components 142 and 143 and such a bit line is detrimental as such a loss of contact will inhibits the flow of current, and thus the functionality of the memory devices depicted in FIG. 9. Further, one having ordinary skill in the art appreciates that having increased consistency in the amount of exposed surface area of top components 142 and 143 may yield increased consistency in the electrical characteristics, for example, electrical resistance, of the memory devices depicted in FIG. 9.

In certain alternative embodiments, the processes described herein may be leveraged to form a semiconductor structure that includes fins (areas that can form vertical channels) covered by a portion of hard-mask, in accordance with an exemplary embodiment of the present invention. For example, a fin of a field-effect transistor (FinFET), which is a MOSFET built on a substrate where the gate is placed on two, three, or four sides of the channel or wrapped around the channel, forming a double gate structure. In some such embodiments, the hard mask wraps down and over a portion of the sides of the bottom component and is ultimately replaced, at least in part, by gate material. In some embodiments substrate layer 134 further represents a silicon on insulator (SOI) substrate. In such an embodiment, fins may be composed of silicon. In one embodiment, portions of the hard-mask are composed of silicon nitride. In other embodiments, portions of the hard-mask are comprised of any material or combinations of materials that will act as a protecting layer during the formation of other semiconductor structures.

In some embodiments, a semiconductor structure with different properties is created by exposing the semiconductor structures to angled ion implantation (e.g., xenon ion implantation), also called tilted ion bombardment, in accordance with an exemplary embodiment of the present invention. In a given embodiment of the invention, the ion bombardment species may be Xe, Ar, Ge, Si, or others, at an energy and dose depending on the bombarding species, but 5 KeV at a dose of $1E14/cm^2$ may be representative. However, other species and doses may be considered as well.

In some embodiments, fins are formed on a SOI substrate, which includes a buried oxide layer (BOX), and a substrate layer. In other embodiments, fins may be formed on a bulk semiconductor substrate. In general, a SOI substrate includes one or more layers of material(s) upon which the semiconductor components/structures can be formed, in accordance with a desired embodiment of the present invention.

In some embodiments, a layer of liner material is deposited on the semiconductor structures. For example, side surfaces of fins and portions of hard-mask are covered by a layer of liner material, in accordance with an exemplary embodiment of the present invention. In this embodiment, the liner material is composed of silicon nitride. In other embodiments, the composition of liner material varies. In general, the liner material is composed of any material that can be selectively altered such that the altered portions and the unaltered portions have different characteristics and resulting propensities for removal.

In some embodiments, the present invention is embodied as an integrated circuit chip that is configured for one or a combination of data storage, machine learning, and data processing.

Embodiments of the present invention may be used in a variety of electronic applications, including but not limited to advanced sensors, memory/data storage, semiconductors, microprocessors and other applications.

A resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described the preferred embodiment of creating planar devices/structures (which are intended to be illustrative and not limiting), it is noted that modifications and variations may be made by persons skilled in the art in light of the above teachings.

The resulting integrated circuit chips (that incorporate planar surfaces) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

Each respective figure, in addition to illustrating the structure of the present invention at various stages, also illustrates the respective steps of the method for the fabrication/manufacture of devices/structures with a more consistent distance between the surfaces of two or more layers of material.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A method of forming a semiconductor device, the method comprising:
    forming a first layer of material on top of a first semiconductor structure, the first layer of material having a first composition and a first index of refraction, the first semiconductor structure being located within 5-100 nanometers to a second semiconductor structure relative to a surface of a layer of substrate;
    forming a second layer of material on top of first layer of material, the second layer of material having a second composition and a second index of refraction, wherein the first layer of material and the second layer of material are of a same type of material; and
    forming an opening to the first semiconductor structure by applying a first etching that etches through at least a first portion of the first layer of material to expose a portion of the first semiconductor structure.

2. The method of claim 1, wherein (i) the first layer of material has a lower rate of material removal during chemical-mechanical polishing than the second layer of material and (ii) the first composition differs from the second composition based on one or both of elemental composition or bonding structure.

3. The method of claim 1, the method further comprising:
    applying first amount of chemical-mechanical polishing to remove at least a first portion of the second layer of material.

4. The method of claim 3, the method further comprising:
    applying a second amount of chemical-mechanical polishing to remove at least a second portion of the second layer of material and a second portion of the first layer of material.

5. The method of claim 1, the method further comprising:
    applying a second etching that removes at least a third portion of the first layer of material prior to forming the second layer.

6. The method of claim 1, wherein a thickness of the first layer of material on top of the first semiconductor structure differs from a thickness of the first layer of material on top of the second semiconductor structure by, at most, (i) three percent or (ii) one standard deviation of an average thickness of the first layer of material across a 5-100 nm portion of a surface of the substrate that includes the first semiconductor structure and the second semiconductor structure.

7. The method of claim 1, the method further comprising:
    forming a third semiconductor structure in at least a portion of the opening such that the third semiconductor structure is in electrical contact with the first semiconductor structure.

8. The method of claim 1, wherein the first semiconductor structure includes at least a portion of semiconductor structures included in a semiconductor memory cell.

9. The method of claim 1, wherein the first semiconductor structure includes at least a portion of semiconductor structures included in a transistor.

10. The method of claim 9, wherein the first semiconductor structure includes a fin included in a finfet transistor.

11. The method of claim 9, the method comprising:
    forming one or more layers of material;
    forming one or more initial semiconductor structures from the one or more layers;
    forming one or more additional layers of material on the one or more initial semiconductor structures; and
    forming the first semiconductor structure using the one or more additional layers of material.

12. The method of claim 11, wherein the one or more initial semiconductor structures comprise one or both of middle-of the-line (MOL) components and back-end-of-the-line (BEOL) components.

* * * * *